United States Patent [19]
Jackson et al.

[11] 3,938,173
[45] Feb. 10, 1976

[54] OPTICALLY COUPLED SEMICONDUCTIVE SWITCHING DEVICES

[75] Inventors: Thomas M. Jackson, Bishops Stortford; Alan D. Brisbane, Epping; Jack R. Peters; Rudolf A. H. Heinecke, both of Harlow; David J. Moule, Saffron Walden, all of England

[73] Assignee: International Standard Electric Corporation, New York, N.Y.

[22] Filed: May 3, 1974

[21] Appl. No.: 466,571

[30] Foreign Application Priority Data
May 4, 1973 United Kingdom............... 21241/73

[52] U.S. Cl..................................... 357/19; 357/38
[51] Int. Cl.² ................. H01L 31/12; H01L 29/74
[58] Field of Search............................... 357/19, 38

[56] References Cited
UNITED STATES PATENTS

| | | |
|---|---|---|
| 3,354,316 | 11/1967 | Deverall..............................357/19 |
| 3,370,174 | 2/1968 | Toussaint.............................357/19 |
| 3,462,605 | 8/1969 | Engeller..............................357/19 |
| 3,636,358 | 1/1972 | Groschwitz..........................357/19 |

*Primary Examiner*—Stanley D. Miller, Jr.
*Assistant Examiner*—E. Wojciechowicz
*Attorney, Agent, or Firm*—John T. O'Halloran; Menotti J. Lombardi, Jr.; Vincent Ingrassia

[57] ABSTRACT

This relates to an optically isolated switching device made by coupling the output of a light emitting diode into a thyristor. Sensitivity is determined by optical flux density rather than total flux. Improved sensitivity is obtained with a mesa construction of a diode mounted on and bonded to a thyristor at a window in its cathode via a glass preform having a high refractive index.

5 Claims, 5 Drawing Figures

OPTICALLY COUPLED SEMICONDUCTIVE SWITCHING DEVICES

BACKGROUND OF THE INVENTION

This invention relates to optically coupled semiconductive switching devices. The mounting of the light emissive diode on the semiconductive pnpn structure enables a good optical coupling efficiency which is further enhanced by the use of a high refractive index material to bond the components together so as to reduce reflection losses at the semiconductor/glass interfaces. A mesa construction of light emissive diode is used as it is found that the switching threshold of the pnpn triggerable structure appears to be more heavily dependent upon light flux density than upon total flux.

SUMMARY OF THE INVENTION

It is an object of the present invention to provide a semiconductive device including a mesa construction light emissive diode mounted on an optically triggerable pnpn semiconductive switching structure with an intervening piece of light transmissive dielectric material providing electrical insulation and optical coupling between the diode and the pnpn structure.

According to a broad aspect of the invention, there is provided "CLAIM 1".

The above and other objects of the present invention will be more clearly understood from the following detailed description taken in conjunction with the accompanying drawings in which;

DESCRIPTION OF THE PREFERRED EMBODIMENTS

Figure 1:
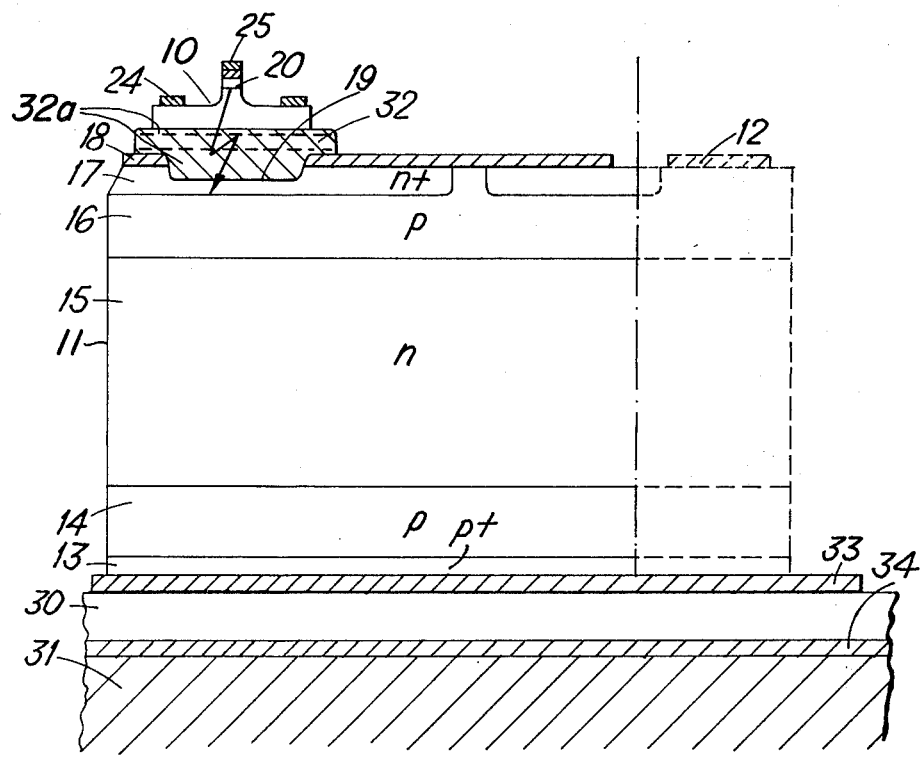
FIG. 1 shows a switching device.

In FIG. 1 a GaAs light emissive diode is shown mounted on a silicon pnpn switching structure chip 11 which is identical with a conventional thyristor with the exception that the portion shown in broken lines including a conventional gate electrode 12 may be omitted.

Figure 2A:
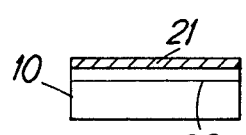
FIGS. 2a, 2b and 2c show successive stages in the manufacture of a light emissive diode which forms a portion of the device.
Figure 2B:
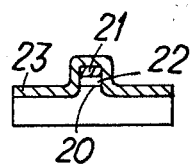
Figure 2C:
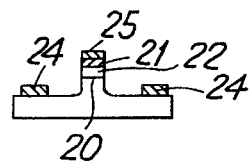

The amphoteric doping properties of Si in GaAs are used to make the rectifying junction 20 of the diode 10. Accordingly the diode is made by liquid epitaxy in a process in which the temperature of the melt is caused to fall through the range 910°C to 880°C. The first part of the resulting epitaxial growth grows in n-type form, and the last part in p-type form, with a continuous graduation between them through a compensated region. The p-type side is covered with a gold/zinc metallization layer 21 (FIG. 2a). Then, using standard photolithographic etching techniques all but the central region of the metallization layer 21 is removed together with the underlying p-type material to leave a small mesa 22 containing the rectifying junction 20. The whole surface is then covered with a gold/tin metallization layer 23 for making contact with the n-type material (FIG. 2b). Part of this layer 23 is then etched away to leave a ring contact 24 (FIG. 2c) surrounding a central contact 25.

The silicon chip 11 (FIG. 1) has substantially the same structure as a conventional thyristor comprising a $p^+$-type layer 13, a p-type layer 14, an n-type layer 15, a further p-type layer 16 and an $n^+$-type layer 17. The major difference is that the portion of a thyristor associated with the provision of a gate may be dispensed with unless a conventional thyristor switching facility is required in addition to the optical switching. The other difference is that the cathode connection is made via a metallization layer 18 provided with a window 19. Within this window some of the underlying $n^+$-type layer 17 is also etched away so that in this region the layer 17 is particularly thin so as to minimize optical absorption losses. The metallization layer 18 is deposited by electroless plating with nickel and then gold.

A thin alumina substrate 30 electrically insulates the silicon chip 11 from an underlying heat sink 31. The entire bottom face of the alumina substrate is metallized 34 for bonding to the heat sink, while the upper surface is provided with four discrete areas of metallization. The silicon chip 11 is bonded to one of these areas of metallization 33 to which anode external lead connection (not shown) is made. The other three areas of metallization (not shown) are used as terminal pads providing electrical connection between main external leads (not shown) and wire leads (not shown) bonded to the metallization layers of the light emissive diode 10 and of the cathode of the silicon chip 11. (A fifth area of metallization, for the gate electrode, will be required if a conventional thyristor switching facility is to be provided.) The thermal impedance between the chip 11 and the heat sink 31 may be further reduced by interposing a molybdenum strip of larger area than the chip between the chip and the alumina substrate. Typically this molybdenum strip has twice the area of the chip.

The next stage of manufacture is concerned with the mounting of the diode 10 over the window 19 with a suitable intervening optical coupling. One form that this coupling can take is a heat fusible glass or plastics preform 32 in which case the diode is placed in position on the preform, and the preform in position on the window 18, and then the assembly is heated to fuse the preform which upon cooling effects the necessary bond. The preform should have a high refractive index in order to minimize reflection losses, should have a high resistivity to provide good electrical isolation, and thirdly should have a thermal expansion coefficient suitably matched with those of the two semiconductive devices to which it is to be bonded.

An example of a glass from which to make the preform is an arsenic-sulphide sulphur glass having a melting point in the region of 300°C. This has a relatively high refractive index and a satisfactory resistivity, but its expansion coefficient is not a good match. However, the mismatch is not fatal because the glass is still relatively soft at room temperature.

Examples of plastics materials from which to make the preform include polyimide, polyethylene, polyester and epoxy resin. A preferred material is polyimide sheeting having a heat fusible coating of polytetrafluoroethylene on both its major surfaces. The advantage of such a material is that when it is heated to effect the bond the polyimide is not fused and hence it is much easier to control the final thickness of insulation separating the light emissive and photoresponsive device than is the case when the whole of the preform is rendered fluid. The same advantage can be obtained with a glass preform by using a similar type of 3-layer sandwich construction comprising a central layer flanked by two layers 32a of lower melting point. Yet another way of obtaining this advantage is to bond the preform to the two devices with a curable adhesive such as an epoxy resin.

After protecting the exposed junctions of the silicon chip with a silicone resin, wire leads (not shown) are bonded between the metallization regions 18, 23, and 24, and the remaining three areas of metallization on the alumina substrate 30. Next the alumina substrate 30 is soldered to the heat sink 31, and at the same time external main leads (not shown) are soldered to all four areas of metallization on the top surface of the alumina substrate, then the assembly is encapsulated in a silica loaded epoxy resin.

Figure 3:
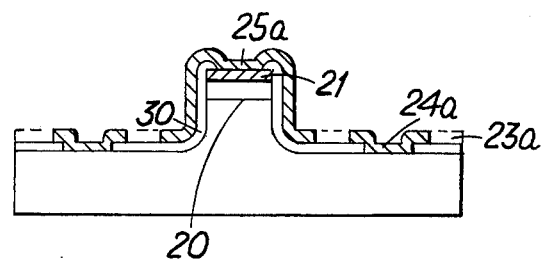
FIG. 3 shows an alternative form of light emissive diode.

An alternative construction of amphoteric silicon doped gallium arsenide mesa diode is depicted in FIG. 3. The construction of this diode is basically similar to that of the diode described previously, but differs in the provision of a passivation layer 30 on the sides of and in the allowing of the metallization layer of the central contact 25a to extend down the sides of the mesa. This layer reflects some of the light that otherwise would have leaked away from the sides of the mesa, and hence a greater proportion of the radiated light is radiated into the underlying photoresponsive device.

The initial stages of manufacture of the diode are the same as for the other construction of diode, but after the etch to form the mesa, and the stripping of the photoresist, the diode is given a further light etch to remove any gold overhanging the side edges of the mesa, and then device is passivated by the pyrolytic or glow discharge deposition of the layer 30 of silica or silicon nitride. Initially the layer 30 covers the whole surface, but windows are etched in it before deposition of a gold tin metallization layer 23a. Then parts of layer 23a are etched away to leave a ring contact 24a surrounding the central contact 25a which, being larger than the mesa, extends down its sides.

For full wave switching two silicon chips and their associated light emissive diodes may be mounted on a common heat sink, and encapsulated together to form a single device. In such a device the silicon chips are connected in inverse parallel while the light emissive diodes are series connected.

It is to be understood that the foregoing description of specific examples of this invention is made by way of example only and is not to be considered as a limitation on its scope.

What is claimed is:

1. An optically coupled semiconductor switching device comprising:
   a light-emitting diode having a mesa construction;
   a triggerable pnpn semiconductor switching structure; and a preformed intervening light transmitting dielectric material coupled between said switching structure and said light-emitting diode for providing electrical insulation and optical coupling between said diode and said structure, said preformed intervening light transmitting dielectric material comprising a first mass of dielectric material coated on opposite sides with a layer of a second dielectric material, said second material having a lower melting point than said first mass and providing a bond between said first mass and said diode and between said first mass and said pnpn structure.

2. An optically coupled semiconductor switching device according to claim 1 wherein said intervening material is glass.

3. An optically coupled semiconductor switching device according to claim 1 wherein said intervening material is a plastic.

4. An optically coupled semiconductor switching device according to claim 1 wherein the sides of the mesa of said light-emitting diode are coated with an electrically insulating protective coating.

5. An optically coupled semiconductor switching device according to claim 4 wherein said electrically insulating coating is coated with a metallization layer.

* * * * *